(12) United States Patent
McCormick et al.

(10) Patent No.: US 6,580,174 B2
(45) Date of Patent: Jun. 17, 2003

(54) VENTED VIAS FOR VIA IN PAD TECHNOLOGY YIELD IMPROVEMENTS

(75) Inventors: Carolyn R. McCormick, Hillsboro, OR (US); Rebecca A. Jessep, Dallas, OR (US); John H. Dungan, Hillsboro, OR (US); David W. Boggs, Hillsboro, OR (US); Daryl A. Sato, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/968,646

(22) Filed: Sep. 28, 2001

(65) Prior Publication Data

US 2003/0064546 A1 Apr. 3, 2003

(51) Int. Cl.[7] .............................................. H01L 23/48
(52) U.S. Cl. ....................................... 257/774; 257/773
(58) Field of Search ..................... 228/180.22; 257/690, 257/691, 692, 734, 737, 738, 773, 774, 779, 786; 438/106, 108, 612, 613, 614, 615, 616, 617

(56) References Cited

U.S. PATENT DOCUMENTS

| 5,842,275 | A | * | 12/1998 | McMillan, II et al. ......... 29/840 |
| 5,875,102 | A | * | 2/1999 | Barrow ........................ 361/777 |
| 6,282,782 | B1 | | 9/2001 | Biunno et al. |

* cited by examiner

Primary Examiner—Kamand Cuneo
Assistant Examiner—Scott B. Geyer
(74) Attorney, Agent, or Firm—Blakely, Sokoloff, Taylor & Zafman LLP

(57) ABSTRACT

An apparatus that includes a substrate, one or more via in pads in the substrate; and one or more vents in at least one of the one or more via in pads, the one or more vents connecting an outer diameter of at least one of the one or more via in pads to a diameter larger than the via.

13 Claims, 15 Drawing Sheets

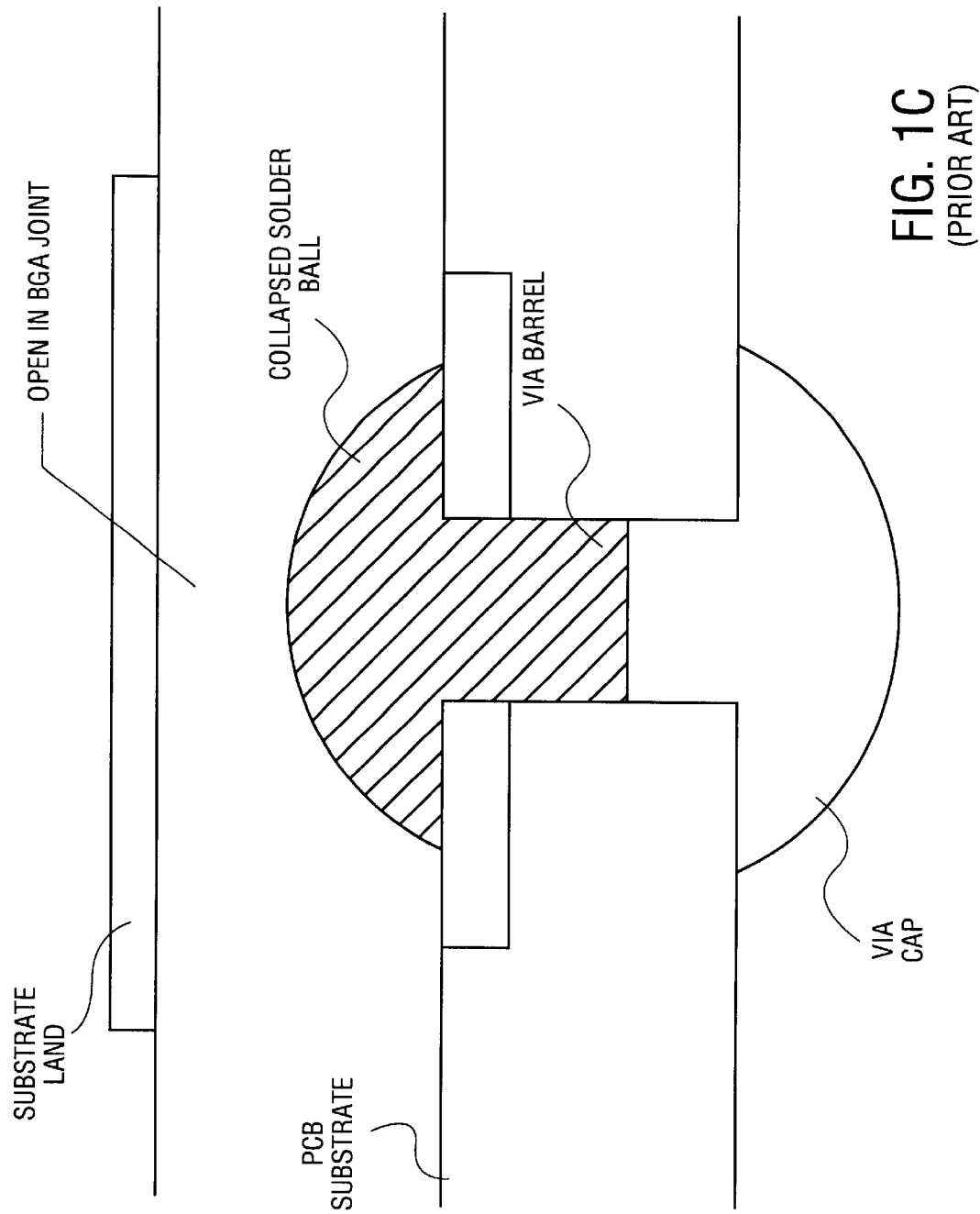

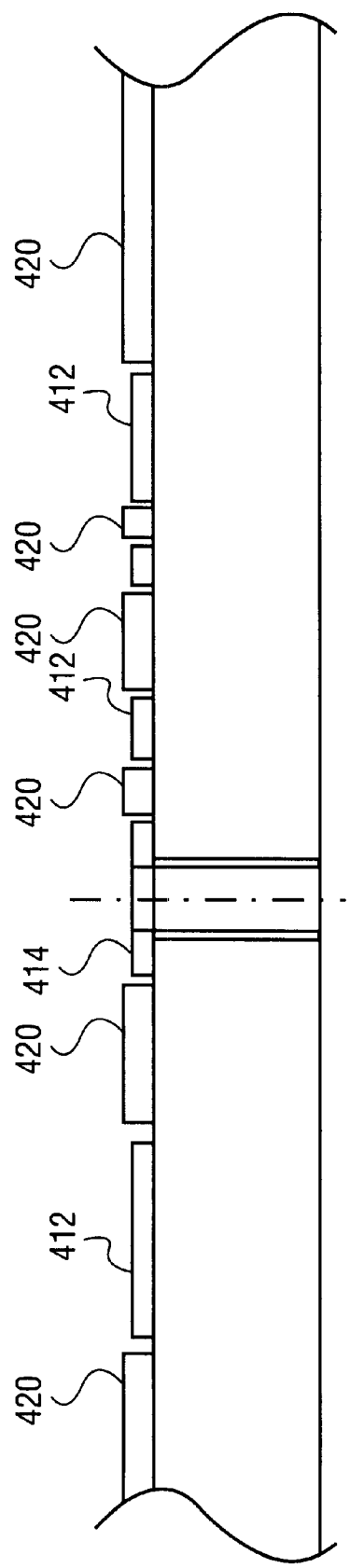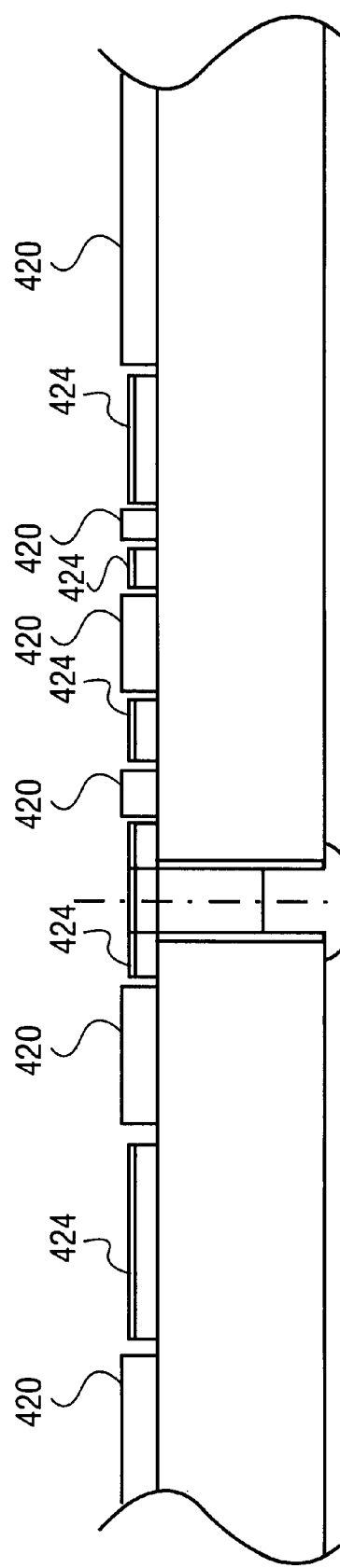

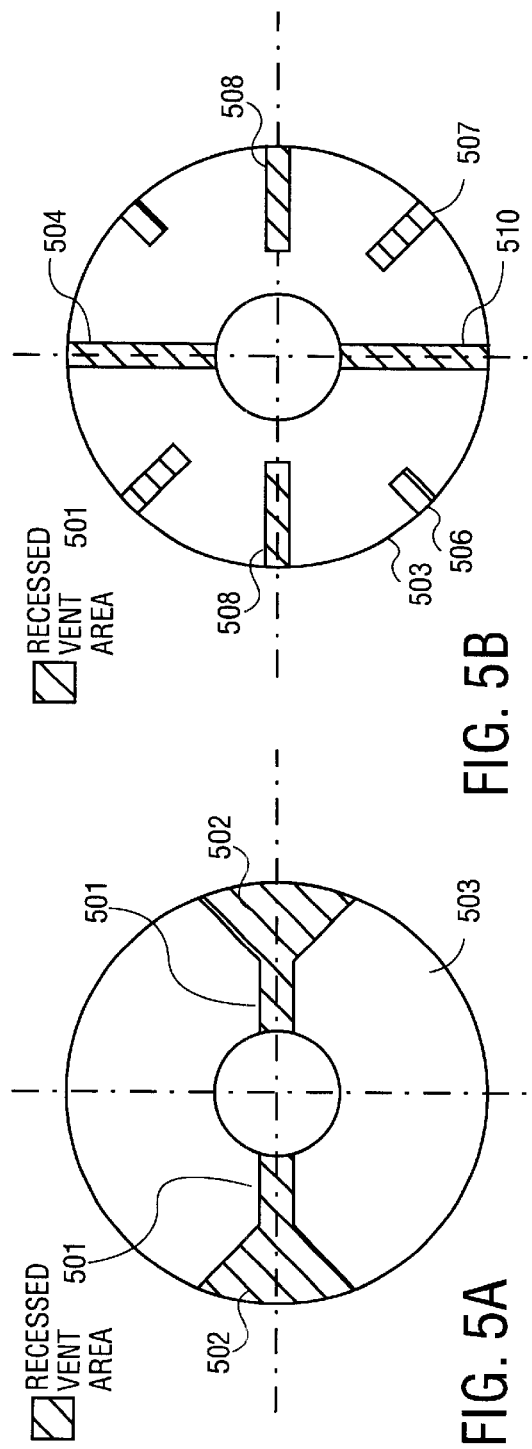
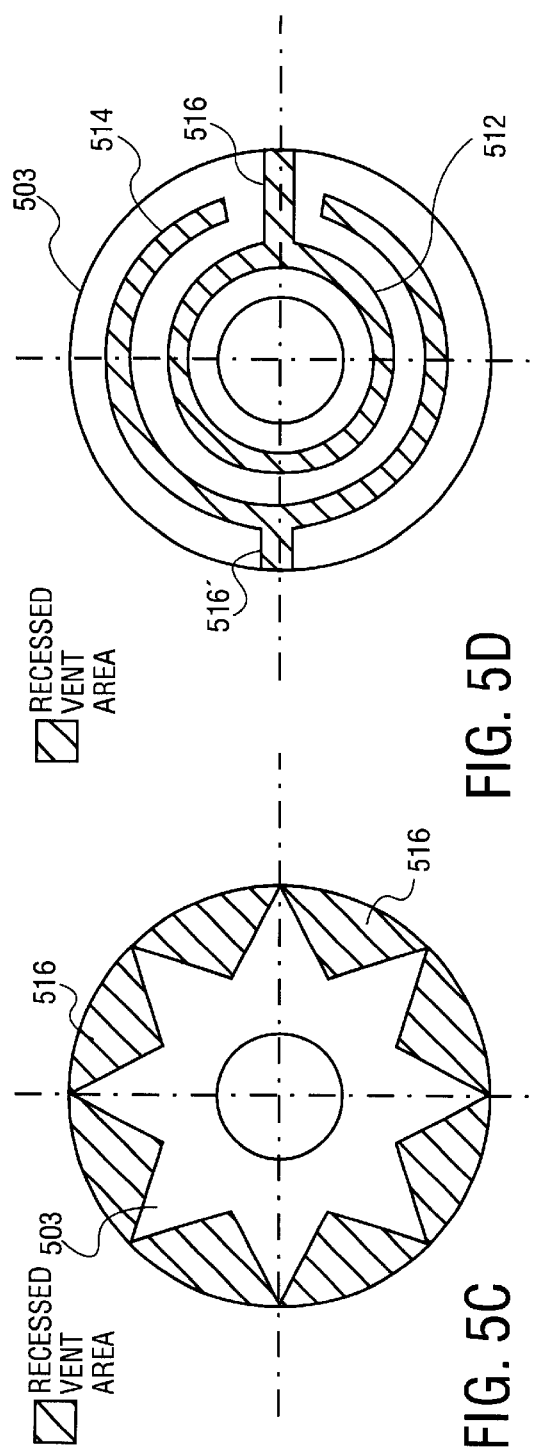
FIG. 5A
FIG. 5B
FIG. 5C
FIG. 5D

VENTED VIAS FOR VIA IN PAD TECHNOLOGY YIELD IMPROVEMENTS

FIELD OF THE INVENTION

This invention relates to the field of assembly between a microchip-package substrate and a second substrate and in particular to attaching a BGA component to the second substrate with improved yields.

DISCUSSION OF RELATED ART

The ever-increasing density improvements in silicon can be more fully exploited with corresponding wiring density improvements in chip carriers. Challenges to increased wire density have been met with ball grid array packaging designs. FIG. 1A is an illustration of a ball grid array (BGA) design. Ball grid array packaging designs are a die housed in a plastic package and typically have via in pad architecture. Solder balls are attached to the BGA package to electrically connect a die within and then electrically connect to a second substrate through the solder balls by a reflow operation. FIG. 1B is an illustration of a short between two solder balls. FIG. 1C is an illustration of an insufficiency of solder that fails in a connection. As the number of solder balls has increased, so have problems with solder ball shorts or insufficient solder joint conditions resulting from via in pad designs. These defects are the result of outgassing from the via barrel during the high temperature cycles involved in a surface mount technology (SMT) process. As shown in FIG. 1B, with opposing via barrel ends capped, outgassing can expand from a via barrel on a mating second substrate into the solder balls causing them to expand until they contact each other or contact an incorrect land creating a short. As shown in FIG. 1C, solder ball expansion from outgassing can cause an implosion of the solder ball resulting in the solder falling into the via barrel creating an open between the BGA land and the mating via in pad of the second substrate.

As circuit line widths are reduced, solder ball arrays will continue to become packed even tighter, and these problems with solder ball shorts and solder insufficiencies will continue to become more severe. As a result, via in pad technology applications can suffer from high yield loss (greater than 1% at the component level) in the SMT manufacturing process. These yield losses, resulting from shorting or opens in BGA joints as well as other leaded components, are the direct result of outgassing of air trapped within the via barrel and/or from volatiles created by materials in the via during the thermal processing.

Currently, the state of art is to cap the via on the PCB side opposite the solder ball and rely on minimizing the volatiles in the via barrel to prevent outgassing and solder implosion during reflow. Fill materials with high solid content may be used or minimization of the via fill material can be done, however neither of these methods control defects to the desired level for cost effective manufacture.

SUMMARY OF THE INVENTION

An apparatus to vent via barrel outgassing of a via in pad during assembly is disclosed. A vent path is placed within the pad of the via in pad that is sized to vent via outgassing for all or a portion of a reflow operation and at a rate that can restrict solder from collapsing into the via barrel. During the reflow operation, outgassing from the via barrel can escape to atmosphere by passing through the vent and around the solder.

BRIEF DESCRIPTION OF THE DRAWINGS

FIG. 1C is an illustration of an insufficiency of solder that fails a connection.

FIG. 4G is an illustration of a pattern placed in the soldermask.

FIG. 4H is an illustration of the application of a solder coating over copper surfaces exposed in the soldermask.

FIG. 5A is an illustration of an alternate embodiment of the vent in a via in pad.

FIG. 5B is an illustration of another alternate embodiment of the vent in the via in pad.

FIG. 5C is an illustration of another alternate embodiment of the vent in the via in pad.

FIG. 5D is an illustration of another alternate embodiment of the vent in the via in pad.

DETAILED DESCRIPTION OF THE PRESENT INVENTION

An apparatus where a first substrate can be electrically connected to a second substrate using solder to act as a connector, where solder on the first substrate can be joined to via in pads of the second substrate, where the pads can have vent paths (vented via in pads) to vent via gasses formed during assembly is disclosed. The first substrate may be in a form, such as, for example a ball grid array (BGA) package to attach solder balls to via in pads on a second substrate such as, for example, a printed circuit board (PCB). The vent path may connect the via gasses to outside atmosphere at all times during processing or, in the case of solder balls, may connect the via gasses to outside atmosphere only at a point in the expansion of the solder ball during a thermal cycle.

At assembly, a reflow operation is performed where a thermal cycle heats the BGA packaging and the mating substrate such as the PCB. The solder balls are in contact with the via in pads on the PCB. During heating, the solder balls can expand because of gasses in the via barrels expanding into the interior of each solder ball. The gasses may be residual atmosphere within the via or may be generated from materials present within the via barrel. The present invention can place one or more vent paths (vents) in the surface of one or more of the pads of the via in pads that are in contact with the solder balls. All or a portion of the expanding via barrel gas that otherwise would contribute to expanding the solder ball may now escape to atmosphere. As a result, expansion of the solder ball due to outgassing from the via can be controlled and limited or eliminated.

In the following description, numerous specific details are set forth such as specific materials, equipment, and processes in order to provide a thorough understanding of the present invention. In other instances, well known computer assembly techniques and machinery have not been set forth in detail in order to minimize obscuring the present invention.

Figure 1A:
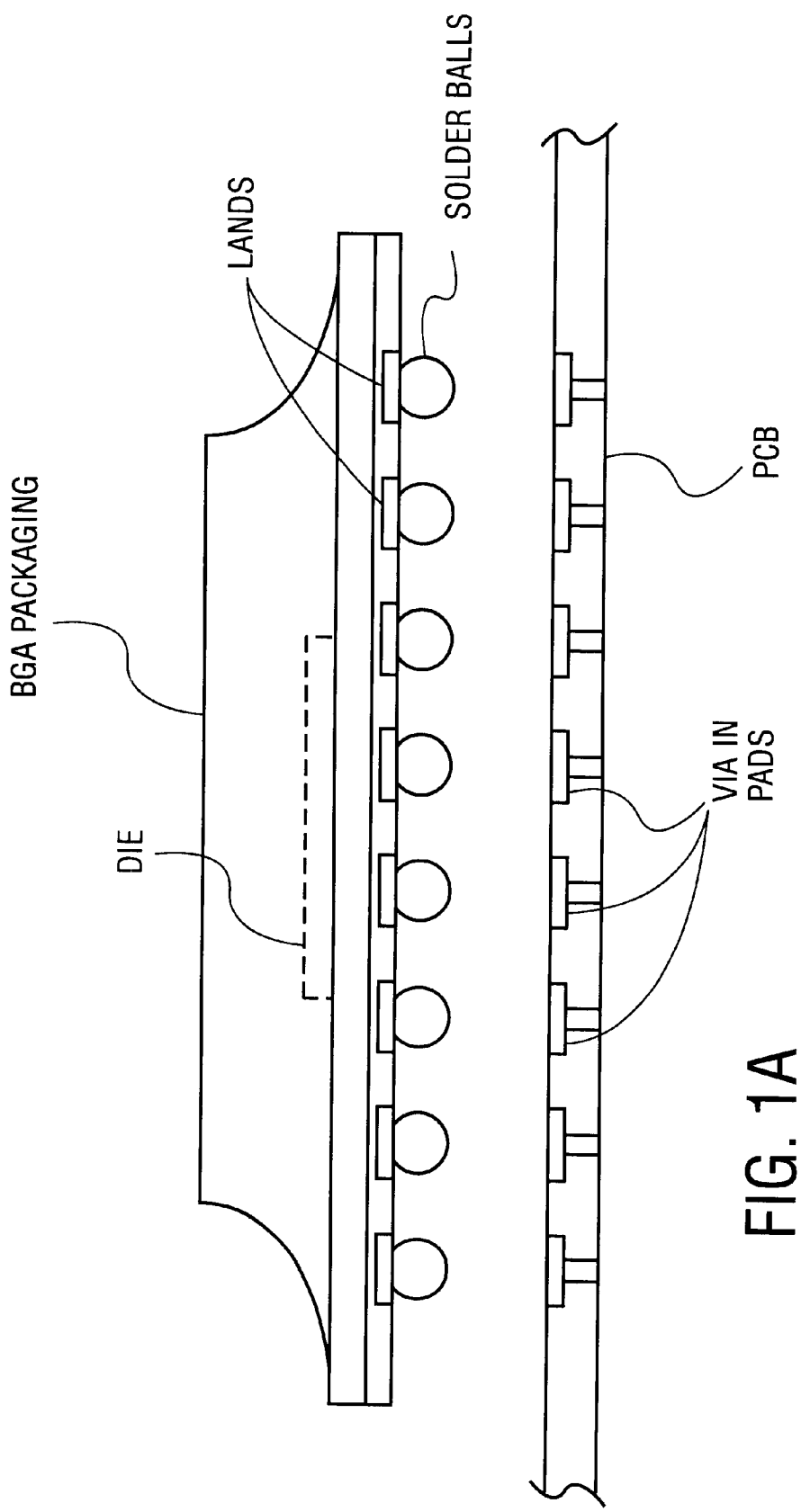
FIG. 1A is an illustration of a ball grid array (BGA) design.
Figure 1B:
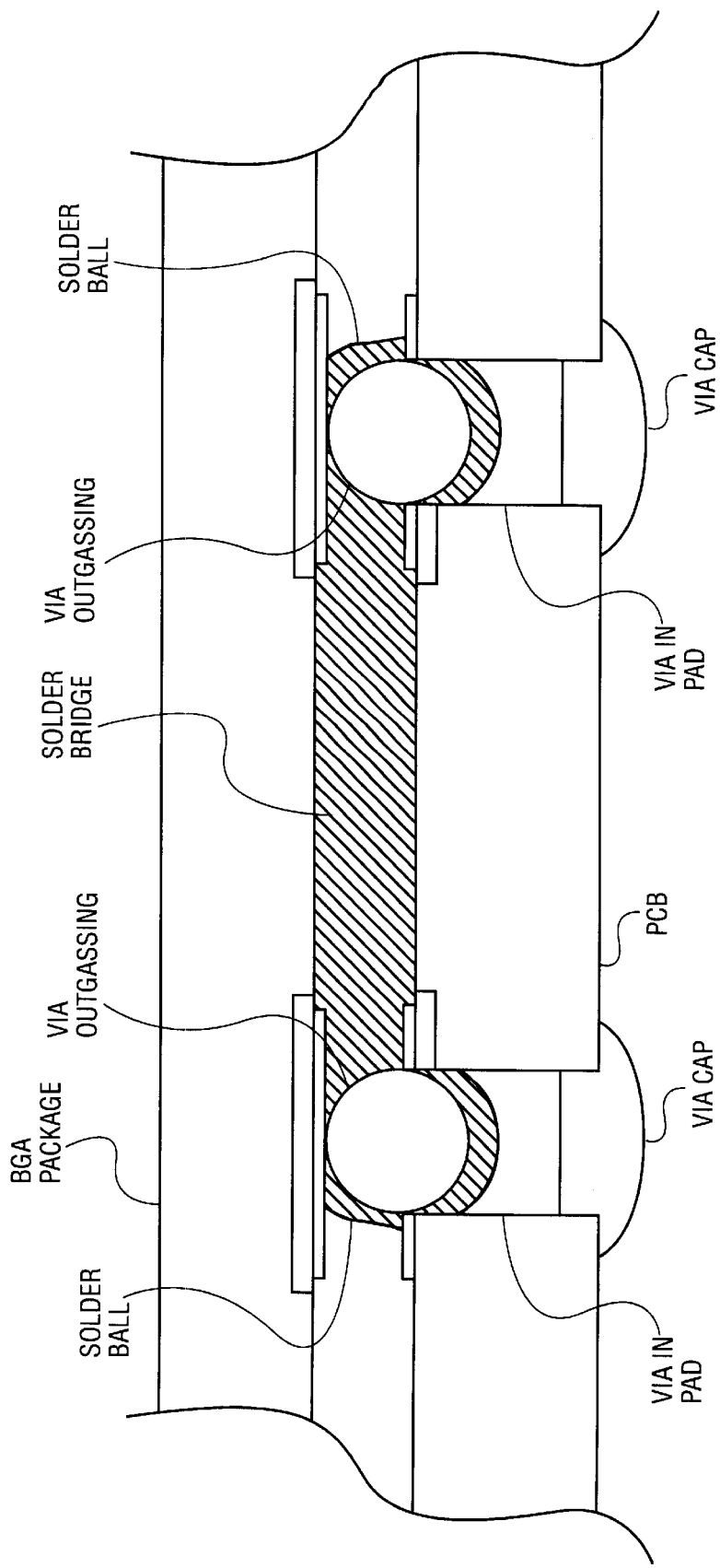
FIG. 1B is an illustration of a short between two solder balls.
Figure 2A:
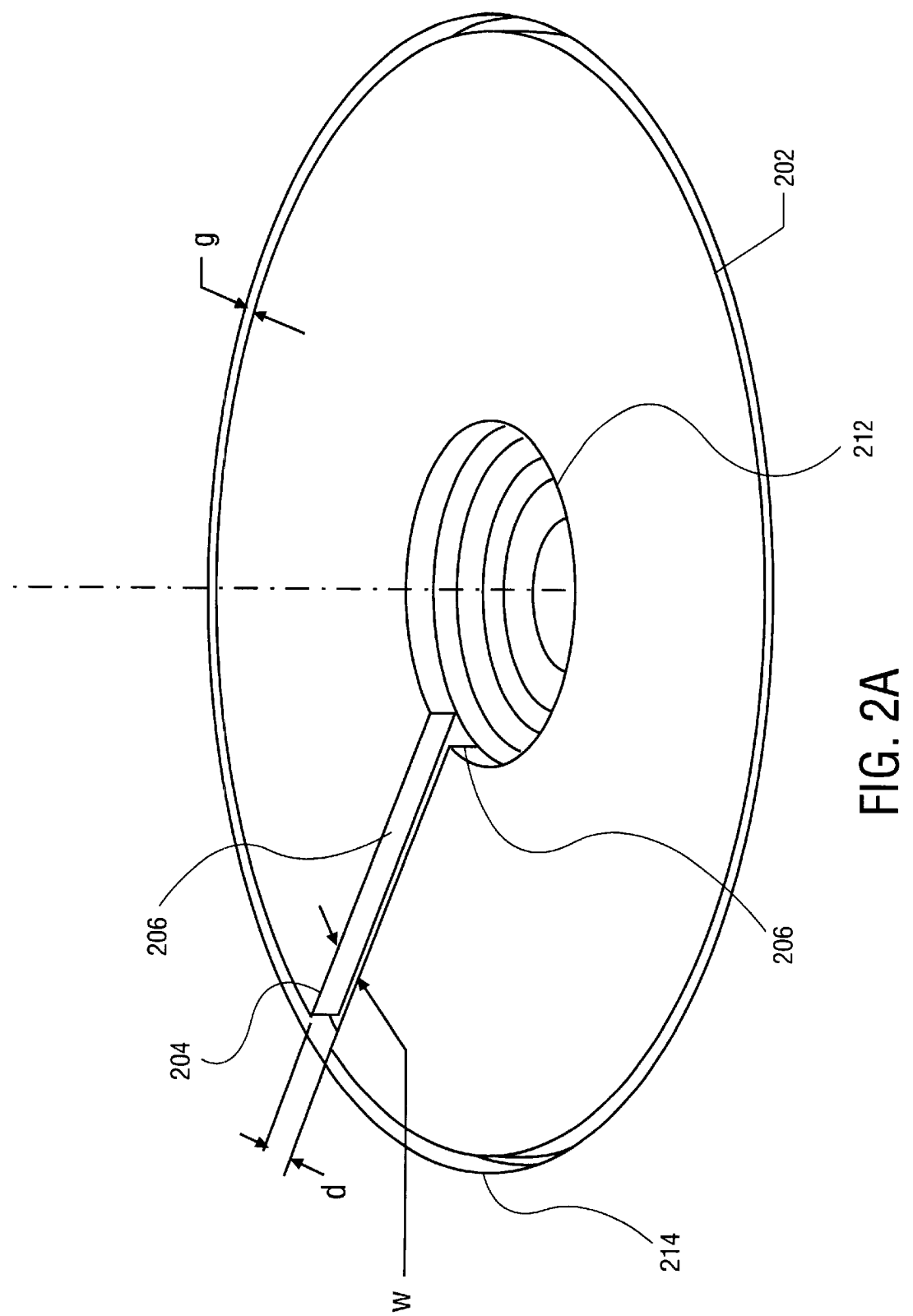
FIG. 2A is an illustration of one embodiment of a via in pad having a vent groove (solder ball removed clarity).
Figure 2B:
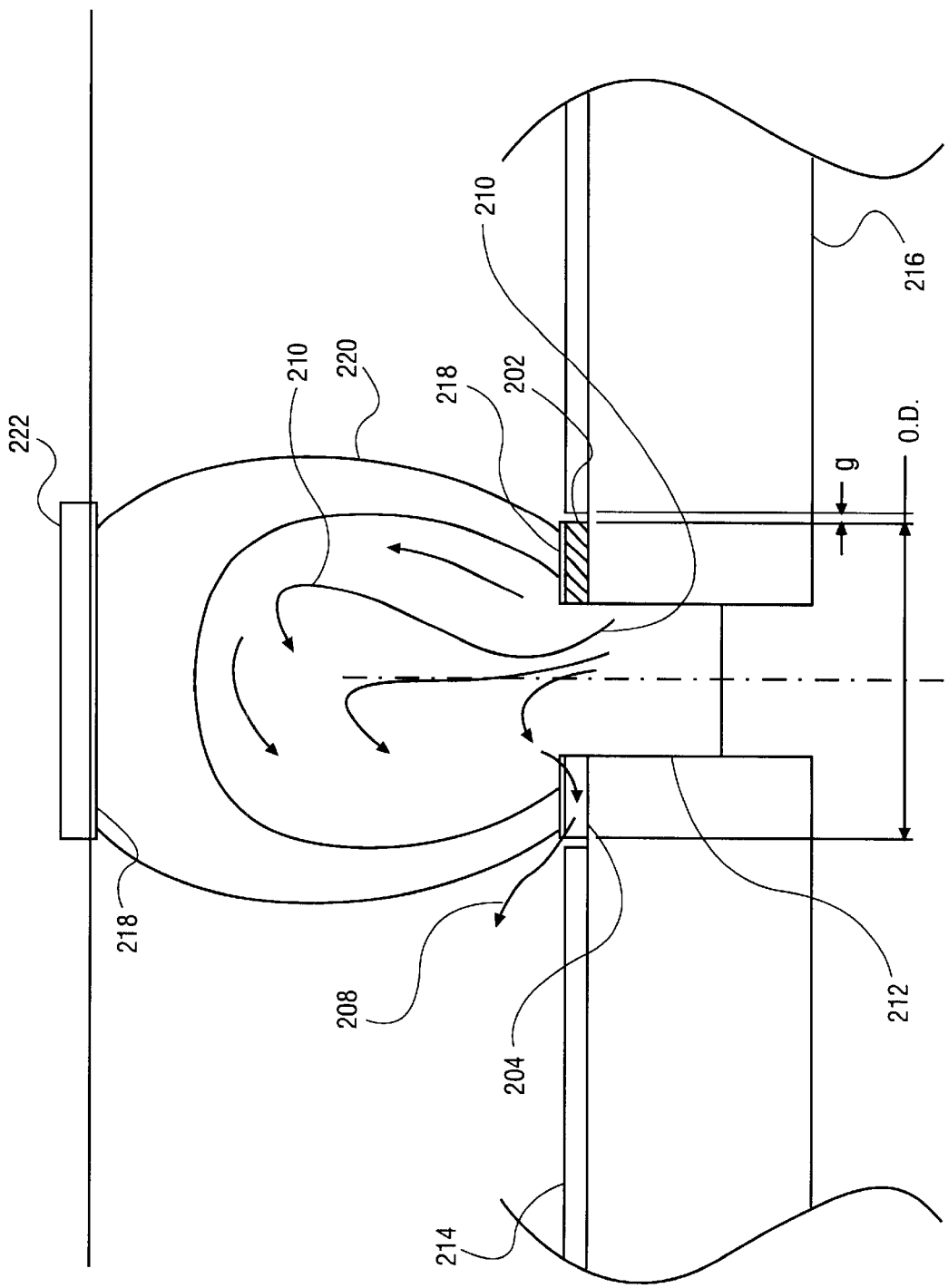
FIG. 2B is an illustration of a cross-section of the one embodiment of a via in pad having the vent groove.

FIG. 2A illustrates one embodiment of a via in pad having a vent groove (solder ball removed for clarity). FIG. 2B illustrates a cross-section of the one embodiment of the via in pad having the vent groove. The PCB via in pad 202 and the BGA pad 222 can be constructed of copper and coated with a thin layer of a solder paste 218. The vent groove 204 can have approximately parallel walls 206 sized to meter escape of the via gas 208 such that some gas 210 remains in the via barren 212 and solder ball 220 when the joint, (i.e. the connection between the two mating lands created by the reflowed solder ball) solidifies. Vent sizing restricts gas from escaping the via barren 212 and the remaining pressure 210 can prevent solder 214 from going into the via barrel 212 causing an insufficient joint condition (FIG. 1C above). In one embodiment, the groove 204 can have a width (w) of approximately in the range of 3–8 mils where 5 mils is preferred. The depth of the groove 204 can be sufficient to expose the underlying substrate material 216 such as fiberglass-epoxy (e.g. FR4). The vent groove 204 can run the entire length from the via in pad diameter 202 to the via barre11 212. Surrounding the PCB pads 202 can be a coating of a soldermask 214 where a gap (g) between the soldermask 214 and the outer diameter (O.D.) of the pad can be approximately 2 mils. Solder will not adhere to fiberglass-epoxy 216 or to solder masking 214 and as a result, the venting path (vent groove 204 plus gap g between pad and masking) will not become filled or clogged with solder during application of the solder paste 218 or attachment by reflow of the solder ball 220.

Figure 3A:
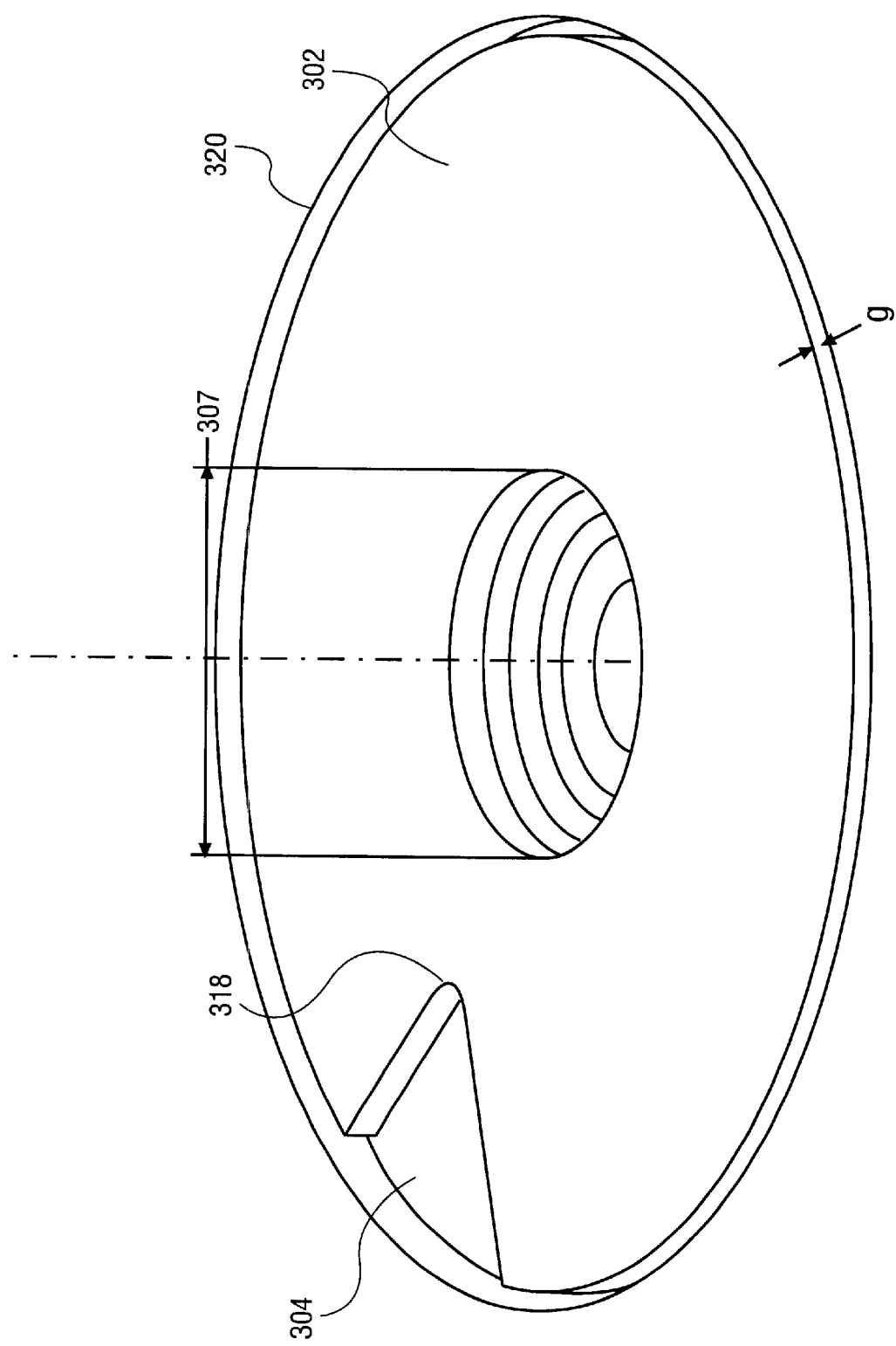
FIG. 3A is an illustration of an alternate embodiment of a via in pad having a vent.
Figure 3B:
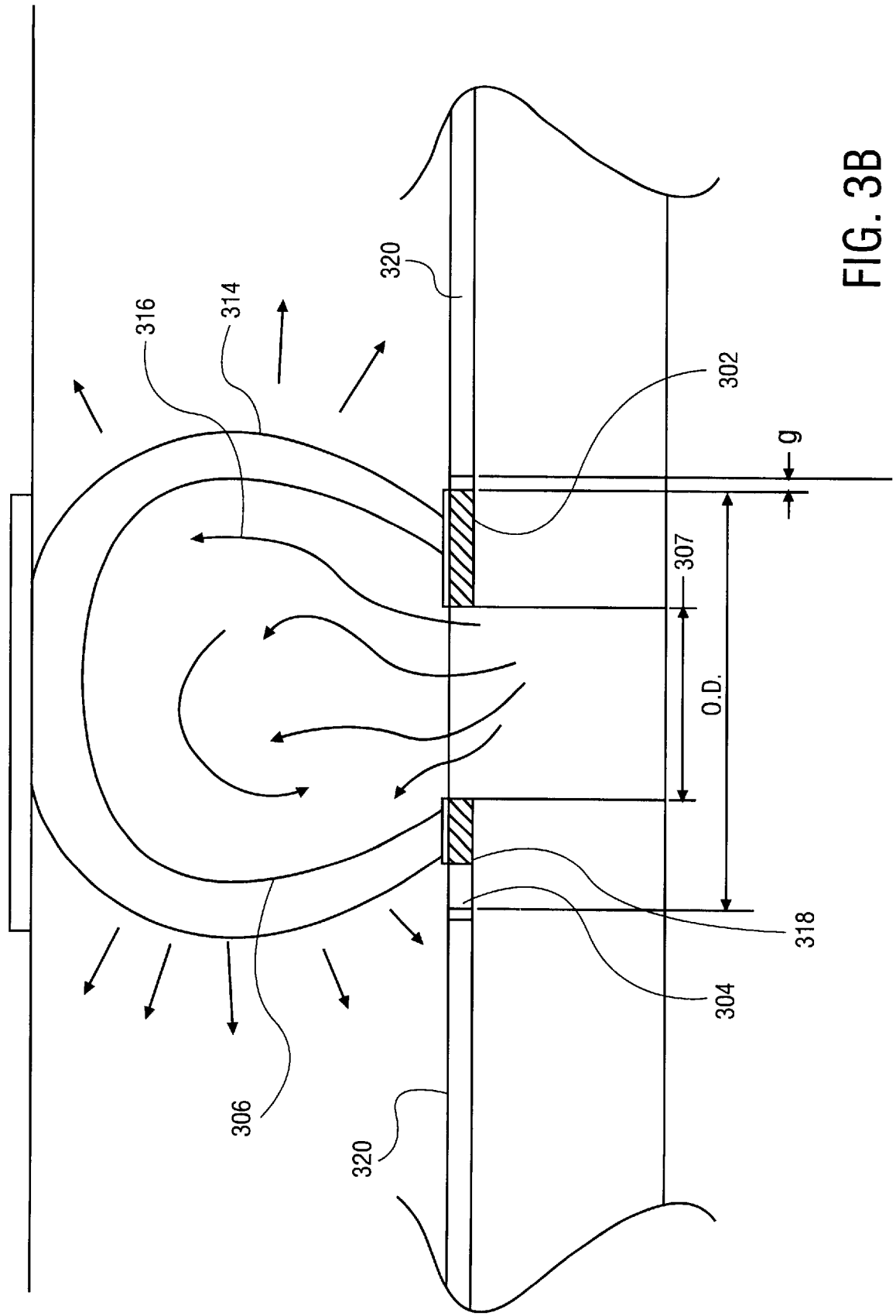
FIG. 3B is an illustration of a cross-section of the alternate embodiment where venting is not occurring.
Figure 3C:
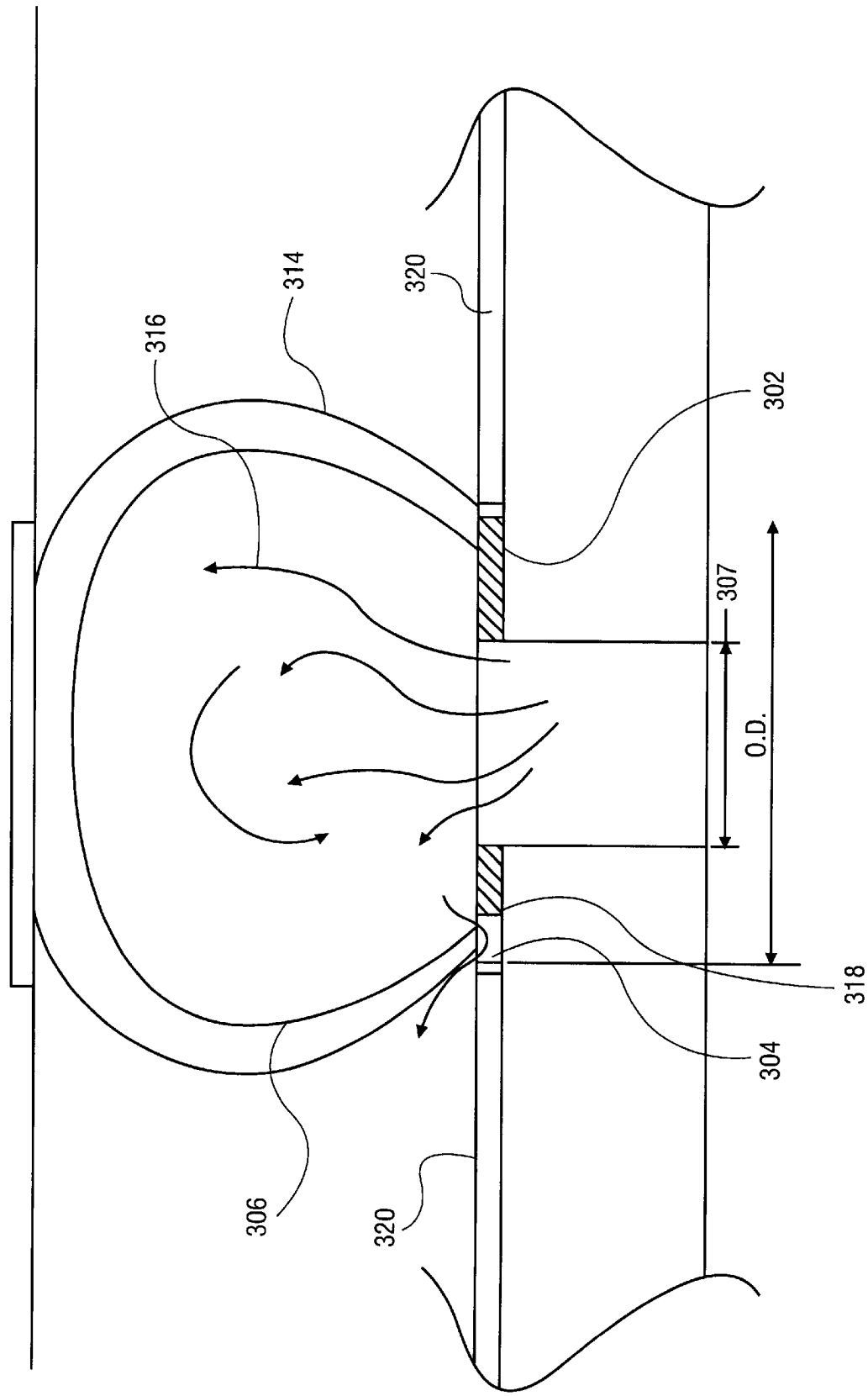
FIG. 3C is an illustration of the cross-section of the alternate embodiment where venting is occurring.

FIG. 3A is an illustration of an alternate embodiment of a vented via in pad (solder ball removed for clarity). FIGS. 3B and 3C are illustrations of a cross-section of the alternate embodiment. Within the pad 302, the vent 304 does not run continuously from the pad outer diameter 306 to the via diameter 307 as does the vent groove 204 illustrated in FIGS. 2A and 2B. In the alternate embodiment, the vent 304 can be roughly shaped like a triangle. With this triangle shaped vent 304, a solder ball 314 (not shown in FIG. 3A for clarity) can begin to expand due to via in pad outgassing 316 with no venting. As shown in FIG. 3B, initially a solder ball void (void) 306, created by the expanding gasses 316 within the solder ball 314, is not physically connected to the vent 304. FIG. 3C illustrates via outgassing passing through the vent. As the void 306 and the solder ball 314 continue to expand, the void 306 crosses over and contacts the triangle vent 304 at the vent apex 318. Once contacted by the void 306 with the vent 304 occurs, outgassing pressure 316 can begin to release or vent to atmosphere (or a lower pressure space). As the void 306 continues to expand due to continued outgassing 316, a cross-sectional area of the vent 304 exposed to the void 306 would increase (as a result of the triangular shape), which could release pressure at a more rapid rate (again to escape through the gap (g) between the pad vent 304 and the soldermask 320). With sufficient pressure released, the void 306 could shrink until the void 306 is no longer positioned over the vent 304 or the void 306 is positioned over a smaller cross-section of the vent 304. With venting stopped or slowed, pressure could again build up, again increasing the size of the solder ball void 306 to a point where the vent 304 would once more begin to release pressure. This "burping" action could repeat as long as outgassing was being generated with sufficient pressure. Alternatively, the solder ball 314 could expand to a point on the vent 304 where outgassing 316 escaping through the vent 304 verses the rate of outgassing 316 could be such that the rate of expansion of the solder ball 314, if only temporarily, would slow or cease.

Figure 4A:
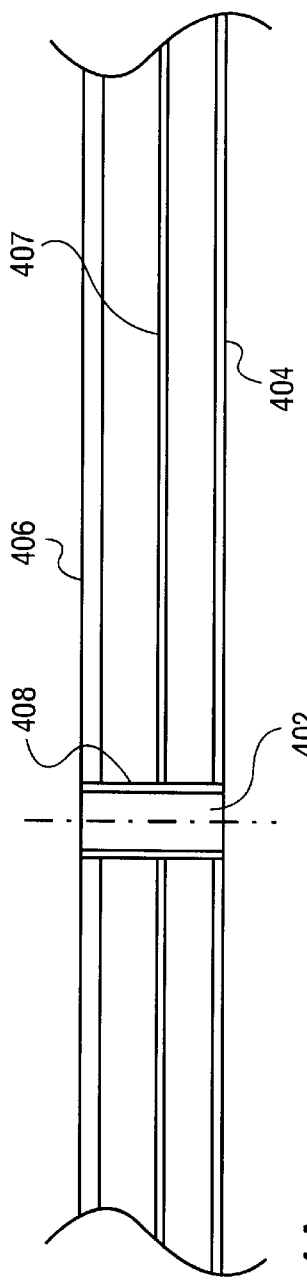
FIG. 4A is an illustration of a BGA substrate having a coating of copper deposited and a via hole.
Figure 4B:
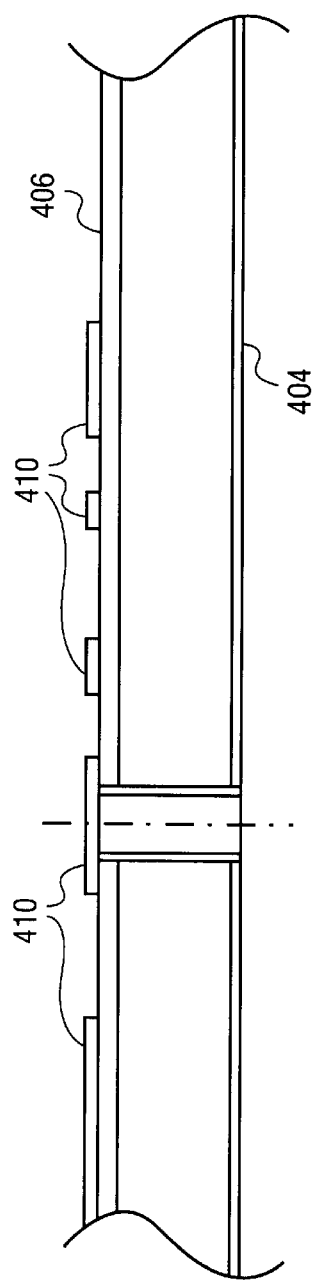
FIG. 4B is an illustration of the copper coating after a photoresist pattern has been applied.
Figure 4C:
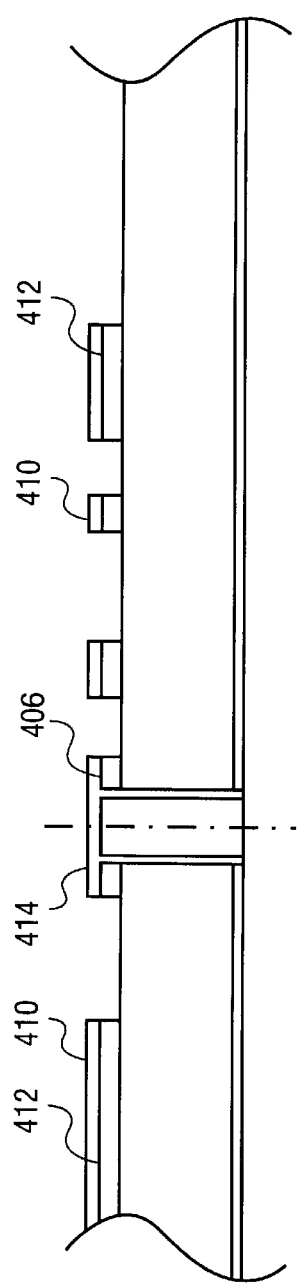
FIG. 4C is an illustration of the copper coating after etch.
Figure 4D:
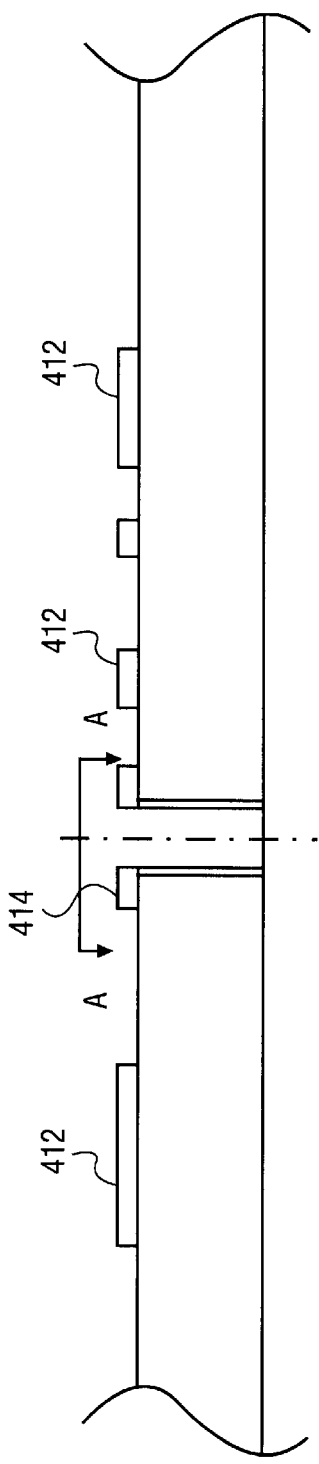
FIG. 4D is an illustration of the etched copper coating after removal of the photoresist.
Figure 4E:
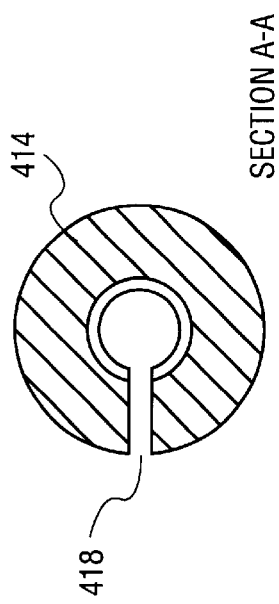
FIG. 4E is an illustration of a top view of a via in pad after copper etching and photoresist removal.
Figure 4F:
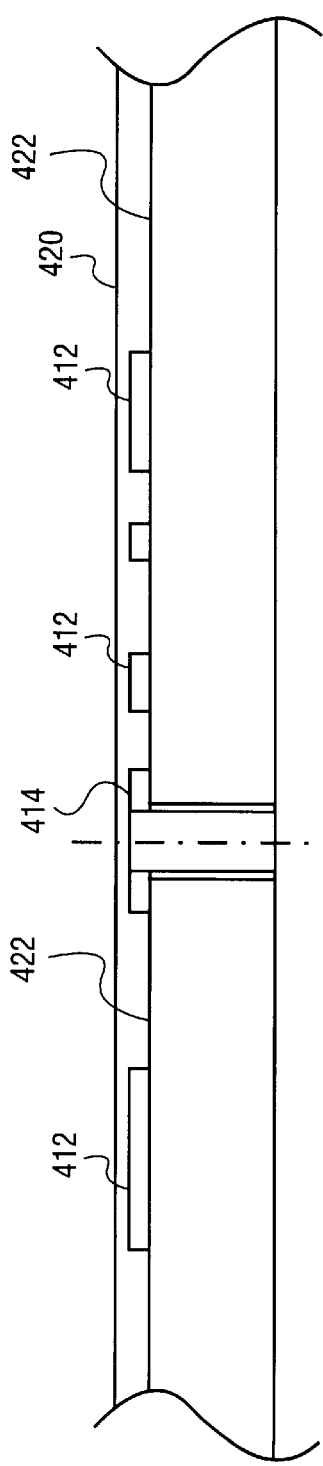
FIG. 4F is an illustration of the application of a solder masking layer.

FIGS. 4A–4F illustrate one embodiment of a method to fabricate the vent within the via in pad. The method takes up at the point where fabrication of the PCB and drilling of via holes have been accomplished. FIG. 4A is an illustration of a via hole 402 in a substrate 404 where the substrate 404 has a 2–4 mil thick coating of copper 406 deposited. The via hole (barrel) can have a lining deposited of electroless copper 408 that can connect the copper lining 406 to layered circuitry 407 (shown in this view only) within and/or on the backside of the PCB 404. FIG. 4B is an illustration of a patterned photoresist coating 410 placed over the copper coating 406. Patterning can consist of first depositing a photoresist layer 410 over the copper layer 406, an image can be exposed in the photoresist layer 410, the image in the photoresist developed, and finally the non-developed (or the developed) portion in the resist can be removed with a chemical bath to expose portions of the copper layer beneath. FIG. 4C is an illustration of the results of a copper etch operation where copper not protected by photoresist 410 is removed. The copper remaining can form circuitry traces 412 and the vented via in pad 414. FIG. 4D is an illustration of the via in pad 414 and copper traces 416 that remain after removal of the photoresist 410 (FIG. 4C). FIG. 4E is an illustration of section A—A, a top view of the vented via in pad 414 where the vent 418 is a groove with parallel walls. FIG. 4F is an illustration of the application of a soldermask coating 420 over the via in pad 414, copper traces 412, and exposed substrate surface 422. FIG. 4G is an illustration of a patterned soldermask 420 after printing an image on the soldermask 420, developing the soldermask 420 and removal of the non-exposed soldermask (or alternatively removal of the exposed soldermask). The patterned soldermask 420 exposes copper traces 412 and vented via in pads 414. FIG. 4H is an illustration of a solder coating 424 applied onto areas exposed in the soldermask 420. Via capping 426 can then be accomplished after the solder operation.

Figure 5E:
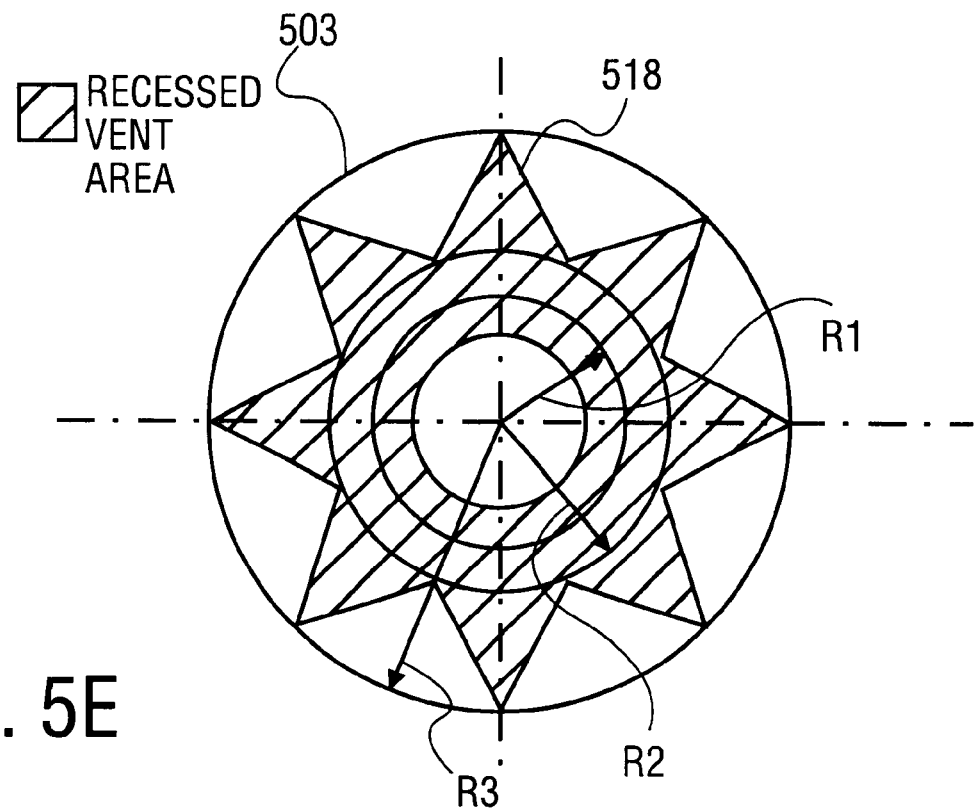
FIG. 5E is an illustration of another alternate embodiment of the vent in the via in pad.

FIGS. 5A–5F are illustrations of alternate embodiments of a vent design. The present invention is not limited to grooves or triangle shaped vents. The vent or vents can have a cross-sectional area that varies to be tailored to release expanding gasses from the via barrel at a variety of rates. The vent can be shaped to vary release of the gasses as the solder ball increases. FIGS. 5A–5D represent vent configurations 502, 504, 506, 508, 510, 512, and 516 that allow for increased vent cross-section exposed to via outgassing as outgassing grows the solder ball void (not shown). FIG. 5A is an illustration of one embodiment of a via in pad vent. FIG. 5A shows parallel walled grooves 501 that transition to triangular grooves 502. The groove 501 provides a uniform cross-sectional area to outgassing until the solder ball void (not shown in any FIG. 5 views for clarity) reaches the triangular vents 502 at the outer area of the via in pad land 503. At this point, the vent cross-sectional area exposed to outgassing increases with further expansion of the solder ball void. FIG. 5B is an illustration of an alternate embodiment of a via in pad vent. FIG. 5B has a number of vents 504, 506, 508, and 510 that are accessible to an expanding solder ball void (not shown) depending on the solder ball void size. As the solder ball void increases, it crosses over more of the vents 504, 506, 508, and 510 that results in an increasing total cross-sectional area exposed to outgassing. Some of these vents 506, 507, and 508 may not run to the via, i.e. their geometry ends at a diameter greater than the diameter of the via, and so will not initially provide an outgassing path. FIG. 5C is an illustration of another alternate embodiment of the vent. FIG. 5C has a "star" shape to the vent 516 which is a combination of triangles that results in an increasing total cross-sectional area exposed to outgassing as the solder ball void (not shown) increases. FIG. 5D is an illustration of another alternate embodiment of the vent. FIG. 5D has a number of vents 512 and 514 that are concentric rings. Each ring 512 and 514 can supply outgassing with a path 516 and 516', respectively, to the atmosphere.

Figure 5F:
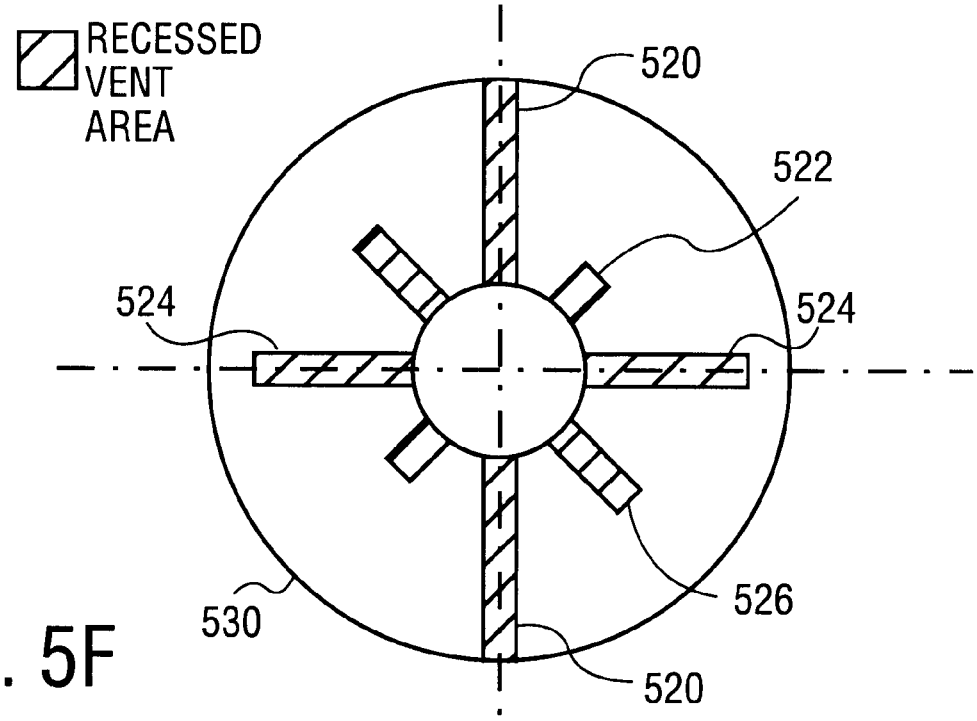
FIG. 5F is an illustration of another alternate embodiment of the vent in the via in pad.

FIGS. 5E and 5F represent vent configurations where a vented via in pad design provides a vent cross-sectional area that can reduce a rate of outgassing as the solder ball void grows. FIG. 5E is an illustration of another alternate embodiment of a via in pad vent. FIG. 5E represents a vent design that is a reverse of the FIG. 5C vent design. The vent 518 is a star shape (in cross-hatch) that is a series of recessed triangles positioned such that initially, a solder ball void at radius R1 is not vented. However, as the solder ball void (not shown) grows, venting can begin when the solder ball void radius is approximately at the midway point R2 in the land 503. Further expansion of the solder ball void will find a reducing vent cross-sectional area until, at the via in pad outer diameter R3, the cross-sectional area may again be either zero or near zero. FIG. 5F is an illustration of another alternate embodiment of a via in pad vent design. FIG. 5F illustrates a series of via grooves 520, 522, 524, 526 where only some of the grooves run from the via 528 to the outer diameter 530 of the via in pad 503. As the solder ball void (not shown) increases it passes over fewer of the vents 520, 522, 524, 526 resulting in a reduced cross-sectional area exposed to via outgassing. One result can be that as outgassing is reduced due to depletion of outgassing materials, a constant contact force can be maintained on the via in pad by the solder as a result of the reduced rate of release of via gasses.

However, it is to be appreciated that the vent configurations can be designed to allow for a rate of outgassing to meet any conditions required. The only limitation for a shape of the vent could be to avoid shapes that create too high a stress riser for the joint (not shown) that could promote a crack within or around the joint from later thermal cycling resulting such as with normal use by a user.

Figure 6A:
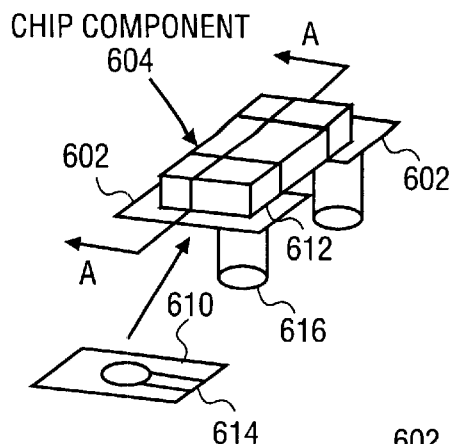
FIG. 6A is an illustration of a surface mount capacitor connected onto a PCB having a vented via in pad.
Figure 6B:
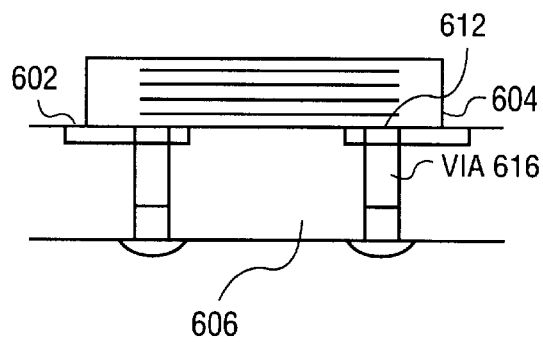
FIG. 6B is an illustration of the capacitor in cross-section.
Figure 6C:
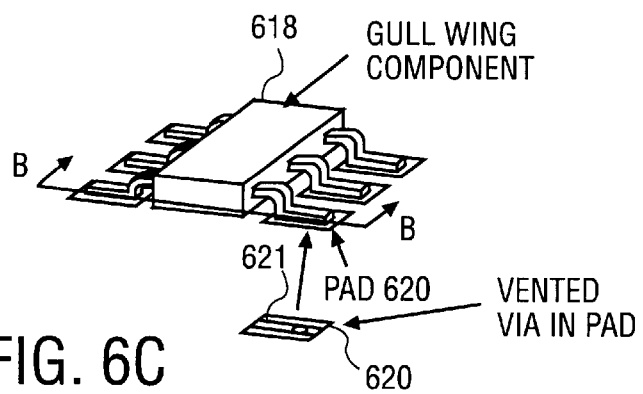
FIG. 6C is an illustration of a gull wing component connected onto a PCB having a vented via in pad.
Figure 6D:
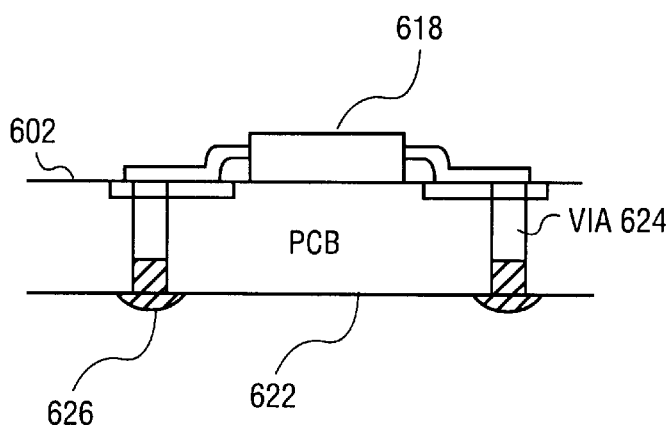
FIG. 6D is an illustration of the gull wing component in cross-section.

The invention can be used with other forms of solder connections. FIG. 6A is an illustration of one embodiment of a non-BGA joint with a vented via in pad. FIG. 6B is an illustration of a cross-section A—A of the non-BGA joint with the vented via in pad. FIGS. 6A & 6B illustrate a surface mount component 604 connected to a vented via in pad 602 on a PCB 606. The non-BGA joint 612 is between the surface mount component 604 and a vented via in pad 602 on a PCB substrate 606. Prior to PCB assembly, ends of the surface mount component 604 can be coated with solder (not shown), these soldered ends can be placed in contact with the via in pad 602. The via in pad contact surface 610 can have a tacky solder coating (not shown). When the solder joint 612 is formed through a thermal cycle such as a reflow operation, any air and unwanted volatiles in the via 616 can expand and the increasing internal pressure in the via 616 can vent to atmosphere through the via in pad vent 614. Venting under these circumstances can preclude an outgassing force from building up until release where such release of pressure could move the surface mount component 604 away from the via in pad 602 creating an open condition. FIGS. 6C & 6D are illustrations of an alternate embodiment of a surface mounted component connected to vented via in pads. FIG. 6C is an illustration of a gull wing component in 3D perspective. FIG. 6D is an illustration of a cross-section B—B of the gull wing component mounted to vented via in pads. The gull wing component 618 is mounted to via in pads 620 having vents 621 on one side of the substrate 622 while the vias 624 are capped 626 at the opposite side of the substrate.

The invention for venting outgassing can be used on chip scale packaging even where the via is filled. Because of outgassing from volatile materials within the filled via, a vent path in the pad for gasses to escape, can still be useful.

In conjunction with vent designs, modifications to the reflow operation can control venting the via gasses. Changes that tailor such methods to the reflow operation could include modifying the ramp up and ramp down rates, i.e. the heating curve (temperature vs. time) of the reflow oven that can include. Setting the heat soak time of the substrates at any given temperature and adjusting the substrate time to remain above the liquid temperature of the solder (183° C.) can also be tailored. The design of the vent in the via in pad can be designed to be integrated with, that is to operate in concert with, the assembly process conditions. That is, the outgassing rates can be tailored by the vent design to take into account and to work along with the process temperatures and times, i.e. the thermal profile.

Figure 7:
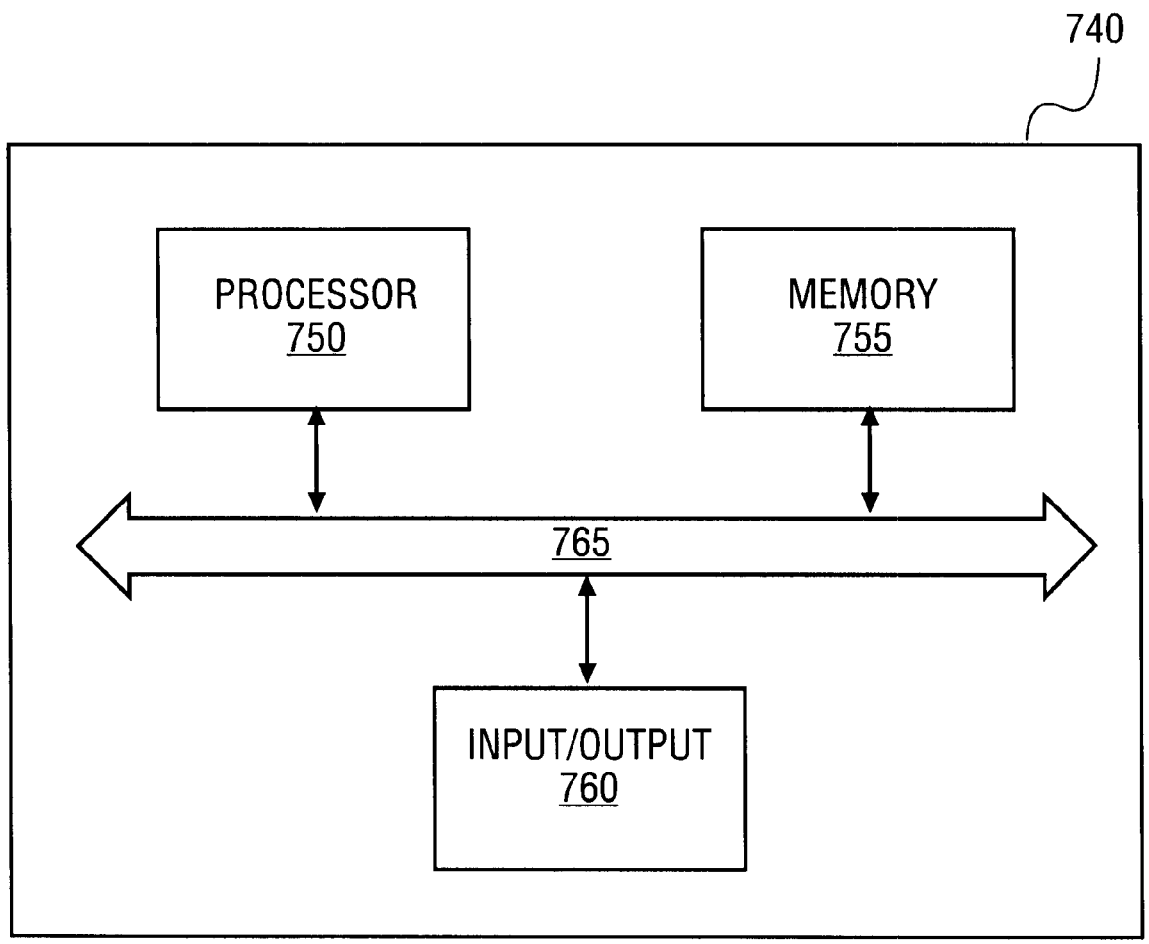
FIG. 7 illustrates one embodiment of a machine such as a computer.

FIG. 7 illustrates one embodiment of a machine such as a computer. The machine 740 may represent various digital processing systems. Machine 740 includes microprocessor 750, memory 755, input/output 760 and bus 765. Bus 765 is coupled to each of processor 750, memory 755 and input/output 760, allowing communication and control there between. Printed circuit boards can be used to connect any of the above computer components such as with the use of solder connections between lands and via in pads or to connect the PCB by a via in pad to a surface mounted component.

In the foregoing, the present invention has been described with reference to specific exemplary embodiments thereof. It will however be evident that various modifications and changes may be made thereto without departing from the broader spirit and scope of the present invention. In particular, the separate blocks of the various block diagrams represent functional blocks of methods or apparatuses and are not necessarily indicative of physical or logical separations or of an order of operation inherent in the spirit and scope of the present invention. The present specification and figures are accordingly to be regarded as illustrative rather than restrictive.

What is claimed is:

1. An apparatus, comprising:
   a substrate;
   one or more via in pads in the substrate; and
   one or more vents in at least one of the one or more via in pads, the one or more vents connecting an outer diameter of at least one of the one or more via in pads to a diameter larger than the via.

2. The apparatus of claim 1, wherein at least one of the one or more vents connects an outer diameter of at least one of the one or more via in pads to a via.

3. The apparatus of claim 1, wherein at least one of the one or more vents is a groove.

4. The apparatus of claim 3, wherein the groove has an approximate depth of 1–2 mils.

5. The apparatus of claim 3, wherein the grove has a depth that exposes the substrate.

6. The apparatus of claim 1, wherein at least one of the one or more vents is a groove having parallel walls.

7. The apparatus of claim 6, wherein the parallel walls are in the range of approximately 3–8 mils wide.

8. The apparatus of claim 7, wherein the parallel walls are approximately 5 mils wide.

9. The apparatus of claim 1, wherein at least one of the via in pads has a plurality of vents.

10. An apparatus, comprising:
    a substrate;
    one or more via in pads in the substrate; and
    one or more vents in at least one of the one or more via in pads, at least one of the one or more vents having a cross-sectional area that varies as the vent progresses toward the outer diameter of the one or more via in pads.

11. The apparatus, comprising:
    a first substrate, comprising:
       a plurality of via in pads containing a plurality of vents, the one or more vents connecting an outer diameter of at least one of the plurality of via in pads to a diameter larger than the via;
    a second substrate; comprising
       a plurality of lands, wherein one or more of the plurality of lands are connected to one or more of the via in pads by one or more solder balls, and the plurality of vents so connected are capable of releasing outgassing from the plurality of via in pads.

12. The apparatus of claim 11, wherein the first substrate is a PCB.

13. The apparatus of claim 11, wherein the second substrate is a BGA package.

* * * * *

UNITED STATES PATENT AND TRADEMARK OFFICE
CERTIFICATE OF CORRECTION

PATENT NO. : 6,580,174 B2
DATED : June 17, 2003
INVENTOR(S) : McCormick et al.

It is certified that error appears in the above-identified patent and that said Letters Patent is hereby corrected as shown below:

Column 3,
Line 40, delete "barren", insert -- barrel --.
Line 43, delete "barren", insert -- barrel --.
Line 52, delete "barrell", insert -- barrel --.

Signed and Sealed this

Twenty-fifth Day of May, 2004

JON W. DUDAS
*Acting Director of the United States Patent and Trademark Office*